United States Patent
O'Keeffe

(10) Patent No.: US 7,394,655 B1
(45) Date of Patent: Jul. 1, 2008

(54) ABSORPTIVE COOLING FOR ELECTRONIC DEVICES

(76) Inventor: William F. O'Keeffe, 820 Laguna Honda Blvd., San Francisco, CA (US) 94127

(*) Notice: Subject to any disclaimer, the term of this patent is extended or adjusted under 35 U.S.C. 154(b) by 168 days.

(21) Appl. No.: 11/370,802

(22) Filed: Mar. 7, 2006

Related U.S. Application Data

(60) Provisional application No. 60/659,302, filed on Mar. 7, 2005.

(51) Int. Cl.
*H05K 7/20* (2006.01)
*F28F 7/00* (2006.01)

(52) U.S. Cl. ............... 361/700; 62/259.2; 165/80.4; 165/104.33; 361/699

(58) Field of Classification Search ............ None
See application file for complete search history.

(56) References Cited

U.S. PATENT DOCUMENTS

| | | | | |
|---|---|---|---|---|
| 4,777,561 A | * | 10/1988 | Murphy et al. | 361/700 |
| 5,168,919 A | * | 12/1992 | Berenholz et al. | 165/80.4 |
| 5,271,239 A | * | 12/1993 | Rockenfeller et al. | 62/259.2 |
| 5,701,751 A | * | 12/1997 | Flores | 62/169 |
| 6,205,803 B1 | * | 3/2001 | Scaringe | 62/259.2 |
| 6,349,558 B1 | | 2/2002 | Ichikawa et al. | 62/434 |
| 6,634,182 B2 | | 10/2003 | Ichikawa et al. | 62/434 |
| 6,931,876 B2 | * | 8/2005 | von Gutfeld | 62/238.3 |
| 7,269,005 B2 | * | 9/2007 | Pokharna et al. | 361/687 |
| 2005/0083654 A1 | * | 4/2005 | Tsoi | 361/699 |
| 2005/0083656 A1 | * | 4/2005 | Hamman | 361/699 |
| 2006/0152903 A1 | * | 7/2006 | Cohen | 361/699 |

OTHER PUBLICATIONS

Mathias Luft, Measuring the 'Thermal' Movement of a Propane Refrigeration Compressor; *The Condition Monitoring Magazine*.
Glenn Elert, Refrigerators, *The Physics Hypertextbook*, http://hypertextbook.com/physics/thermal/refrigerators; pp. 1to 8, May 11, 2004.

* cited by examiner

*Primary Examiner*—Gregory D Thompson
(74) *Attorney, Agent, or Firm*—Fliesler Meyer LLP

(57) ABSTRACT

Embodiments of this invention include active electrical components withing a housing that contains an absorptive cooler. The absorptive cooler is used to cool active electrical components, such as central processors or other heat-sensitive components. In some embodiments, heat produced by electronic components can be used to provide heat to the absorptive cooler. By using heat generated from within the housing of the electronic device or other heat-producing element to drive an absorptive cooler, temperatures within heat-sensitive elements, such as a central processing unit can be reduced with a minimum of energy loss, and thereby permitting faster processing speed and reduced power consumption.

9 Claims, 12 Drawing Sheets

ABSORPTIVE COOLING FOR ELECTRONIC DEVICES

PRIORITY CLAIM

This application claims priority under 35 U.S.C. § 119(e) to U.S. Provisional Patent Application No. 60/659,302, filed Mar. 7, 2005, William O'Keeffe, Inventor, entitled "Absorptive Cooling for Electronic Devices,". This application is expressly incorporated herein fully by reference.

BACKGROUND

1. Field of the Invention

This invention relates to cooling devices for electronic components. Particularly, this invention relates to absorptive coolers and their use in electronic devices, such as computers. More particularly, this invention relates to devices and systems for keeping central processors and other active computer elements cool using heat generated by the electronic device.

2. Description of the Art

Electrical components that have active computational elements (e.g., computer processors, or "chips") have become smaller over the decades since they were first introduced. As devices become smaller, the power consumption has been decreased, and computer speeds have increased. However, computer processing speed is limited by certain factors, including the operating temperature of the processor. Thus, at low temperatures, processor speeds are higher than for the same processor operating at a higher temperature. Thus, an ongoing objective is to provide efficient means for cooling active computer components such as processors.

Currently, electronic components are cooled by air movement produced by fans, which are run by electrical motors. The cooling efficiency of such systems is relatively low, due, at least in part, to the relatively low heat carrying capacity of gases, such as air, nitrogen and other gases used for conventional cooling devices. Cooling efficiency is so low, in fact, that many systems are required to operate in a temperature controlled (i.e., air conditioned) environment, such a cold room. Failures of air conditioning systems in such rooms can lead to widespread decreases in computing power and speed.

Therefore, there is a need for simple, efficient cooling systems that can be integrated into electronic devices.

SUMMARY

In certain embodiments of this invention, an electronic device can have within the shell, an absorptive cooling system that takes advantage of heat generated by the electronic device to power the cooling system. In such embodiments, there can be a tendency for "negative feedback" such that as power consumption by the electronic device increases, the flow of heat away from the electronic component can increase to a degree greater than for simple passive heat dissipation. In some embodiments, a processor can be kept cool by circulation of cooling fluid through a stage, platform, or other surface on which the processor is installed. Heat produced by the processor flows into the cooled stage and is dissipated ultimately to the outside of the shell of the electronic device. As a result, the temperature of the processor can be maintained at a lower temperature, thereby can run at a higher processor speed.

In some embodiments, an active electronic element to be cooled can be located inside a cowling within the electronic device and the cowling can be filled with a heat exchange fluid, such as a dielectric liquid. By providing direct contact between an element to be cooled and a cooling liquid, the heat transfer from the element can be substantially increased over the cooling provided by a gas, such as air.

In other embodiments, a critical element to be cooled (e.g., a central processing unit or CPU) can be separated from non-critical elements and/or from heat-producing elements, such as transformers, motors or other elements using barriers that may include an insulating layer.

In some embodiments, cowlings can be used to concentrate heat generated by components to more efficiently power an absorptive cooler. In other embodiments, a cowling can be used to thermally isolate components to be cooled from other components in the electrical device. In still further embodiments, insulating materials can be associated within a cowling to more efficiently control heat within an electronic device.

BRIEF DESCRIPTION OF THE FIGURES

This invention is described with reference to particular embodiments thereof. Further aspects of the invention are described in the Figures, in which.

DETAILED DESCRIPTION

Absorptive coolers operate, in general, using principles that have been applied, for example, to gas or propane fueled refrigerators. Basically, absorption coolers apply Dalton's Law, which states that the total pressure of a confined mixture of gases is the sum of the pressures of each of the gases in the mixture. For most terrestrial environments (including those where computers and other electronic devices may be used), the total pressure of the air in a compressed air cylinder is the sum of the oxygen, nitrogen, carbon dioxide and water vapor (if present). In some embodiments, an absorptive cooler is contained within a shell or housing of an electronic device. In other embodiments, an absorptive cooler has a condenser as part of the shell or housing of the device.

Figure 1:
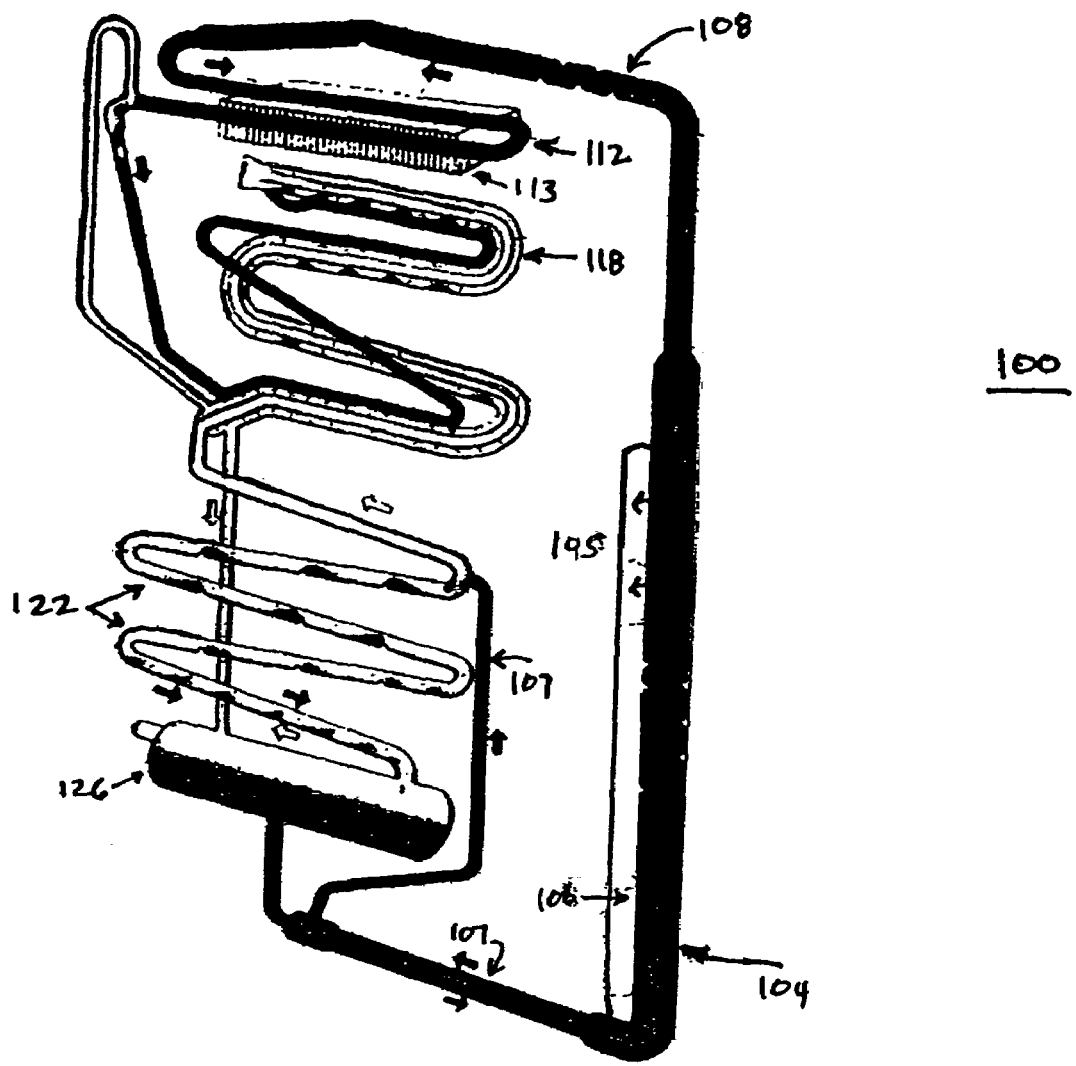
FIG. 1 depicts a schematic diagram of an absorptive cooler of the prior art.

FIG. 1 depicts an continuous cycle absorptive cooler 100 and its operation.

In general, an absorptive cooler 100 has (1) a generator or boiler 104 containing the cooling mixture, such as water, ammonia and hydrogen, (2) a separator 108, (3) a condenser 112, (4) an evaporator 118 and (5) an absorber 122. These components are arranged so that a cycle is produced.

For purposes of illustration only, the device is charged with a mixture of water, ammonia and hydrogen under sufficient pressure to condense the ammonia at room temperature. When heat is applied to boiler 104, bubbles of ammonia gas are produced. The bubbles rise and carry with them quantities of a relatively weak solution of water and ammonia. The weak solution passes out of the tube (left arrows at 106 and down tube 106 and then through tube 107. Ammonia vapor rises into the water separator 108, where water condenses and runs back into the boiler system (not shown), leaving dry ammonia vapor to pass to the condenser 112. Air circulating over fins 113 of condenser 112 removes heat from the ammonia vapor, which can then condense into liquid ammonia, and then flows into the evaporator 118. Evaporator 118 is supplied with hydrogen, which passes across the surface of the liquid ammonia. This lowers the vapor pressure of the ammonia vapor sufficiently to permit the liquid ammonia to evaporate. Evaporation of ammonia extracts heat from evaporator 118. This cools evaporator 118.

The mixture of ammonia and hydrogen vapor then passes from evaporator 118 to the absorber 122, which is fed by gravity flow from tube 107. Some of the weak ammonia/water solution passes from tube 107 where it comes into contact with the mixture of ammonia and hydrogen gases. Ammonia is absorbed from the mixture and hydrogen is then free to rise through a coil of absorber 122 and return to evaporator 118.

A strong ammonia solution produced in absorber 122 flows down to an absorber vessel 126. From absorber vessel 126, the solution passes to boiler 104, thereby completing the cycle of operation. This cycle can be maintained so long as boiler 104 remains heated.

In embodiments of this invention, evaporator 118 is in thermal contact with an element to be cooled. The term "thermal contact" means that evaporator 118 may be in direct physical contact with the element to be cooled. Alternatively, thermal contact also includes situations in which evaporator 118 cools a fluid, that is then transferred to the element to be cooled. Additionally, the term "thermal contact" refers to situations in which a heat-producing element is in direct physical contact with a boiler, or in which a heat-producing element warms a fluid, that is then transferred to a boiler.

The difference in pressure in a continuous system as described above is created by hydrogen gas. The hydrogen gas causes the ammonia to change pressure and permits it to boil off in the evaporator.

Several types of coolants have been used in absorptive coolers. They include in addition to ammonia, sulfuric acid, carbon dioxide, sulfur dioxide, methyl chloride, hydrocarbons, halocarbons (e.g., Freon®, Genetron®, Isotron® and the like. For most of the discussion that follows, ammonia systems will be described, but it is to be understood that any suitable cooling agent can be used.

In embodiments of this invention, the above-described continuous system can be made sufficiently small so as to fit conveniently within a case for an electrical device, such as a computer. In many of these embodiments, evaporator 118 can be used to cool a heat exchanger as shown in FIG. 2 below.

Figure 2:
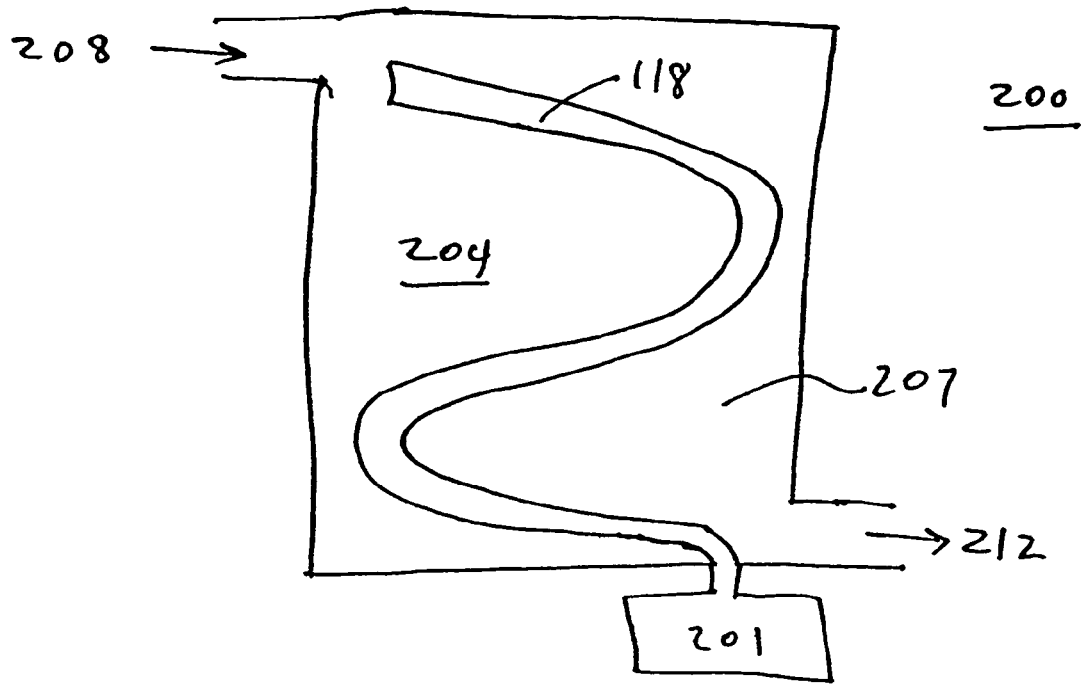
FIG. 2 depicts a schematic diagram of an embodiment of this invention showing an absorptive cooler within a heat exchanger associated with a processor.

FIG. 2 depicts a schematic diagram of an embodiment of this invention 200 having evaporator 118 as described above (remainder of absorptive cooler 201 not shown in detail here) within heat-exchanging reservoir 204. Heat-exchange reservoir 204 contains heat-exchange fluid 207 that flows into reservoir 204 at 208. Fluid 207 flows out from reservoir 204 at 212. When the heat exchange fluid 207 is warmed, for example, by operation of an electronic device, warm heat exchange fluid enters reservoir 204 by tube 208, where the fluid is cooled by evaporator 118 and cooled fluid exits reservoir 204 via tube 212 and can be returned to the electronic device, where the fluid is warmed by heat produced by the electronic device.

Figure 3:
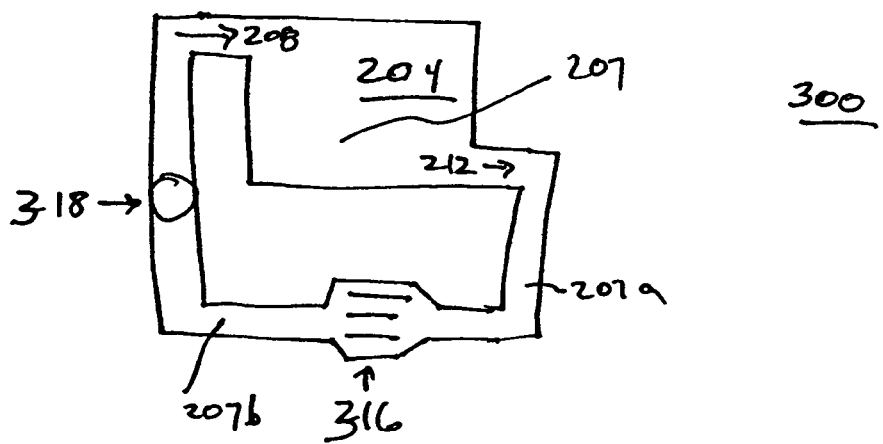
FIG. 3 depicts a schematic diagram of an embodiment of this invention wherein an electronic device is cooled by an absorptive cooler.

FIG. 3 depicts a schematic diagram of an embodiment of this invention 300 that uses a reservoir 204 containing heat exchange fluid 207 to cool an electronic device 316. Electronic device 316 produces heat that flows into cool heat exchange fluid 207a, thereby warming the fluid. Pump 318 circulates warmed heat exchange fluid 207b from device 216 to heat exchange reservoir 204, where fluid 207 is cooled. Cool fluid exits heat exchange reservoir 204 at 212 and flows back to electronic device 316.

It can be appreciated that a variety of heat exchange fluids can be used with embodiments of this invention. For some uses, it can be desirable to use water, due to the relatively high heat carrying capacity of water. For other uses, in particular, those in which the exchange of heat from an electronic device (e.g, processor) is carried out by a series of small diameter tubes embedded within a stage holding the device, it may be desirable to use less viscous fluids, such as alcohols.

Figure 4:
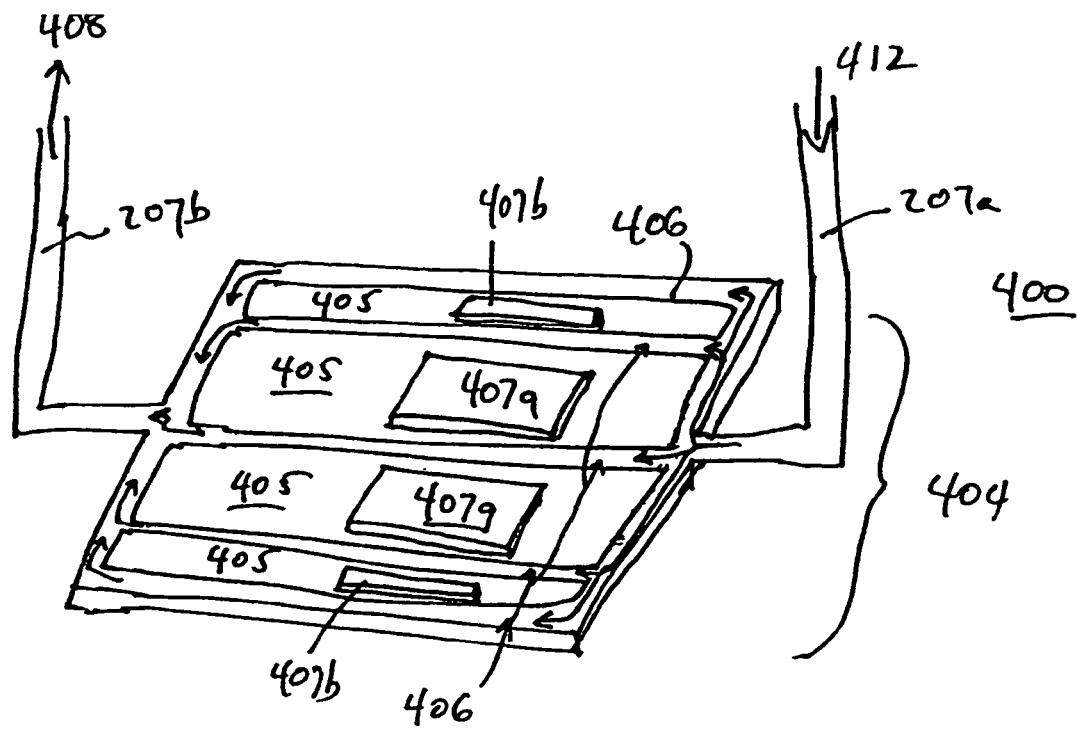
FIG. 4 depicts a schematic diagram of an embodiment of components of an electronic device having channels for flow of a heat-exchange fluid adapted to be cooled by an absorptive cooler.

FIG. 4 depicts an embodiment of this invention 400 in which an absorptive cooler is used with a heat exchanger (not shown) to cool a portion of an electronic component 404 having stage 405 with channels 406 therein for circulation of heat exchange fluid. Portions of stage 405 have electronic components (e.g., 407a and 407b) thereon that generate heat when in use. Cool heat exchange fluid 207a flows into the device at 412 and is distributed to channels 406, thereby cooling portions of stage 405. Heat produced by elements 407a and 407b passes into cooled stage portions 405 and the heat passes into the heat exchange fluid 207b, which then passes back to heat exchanger via tube 408.

Figure 5:
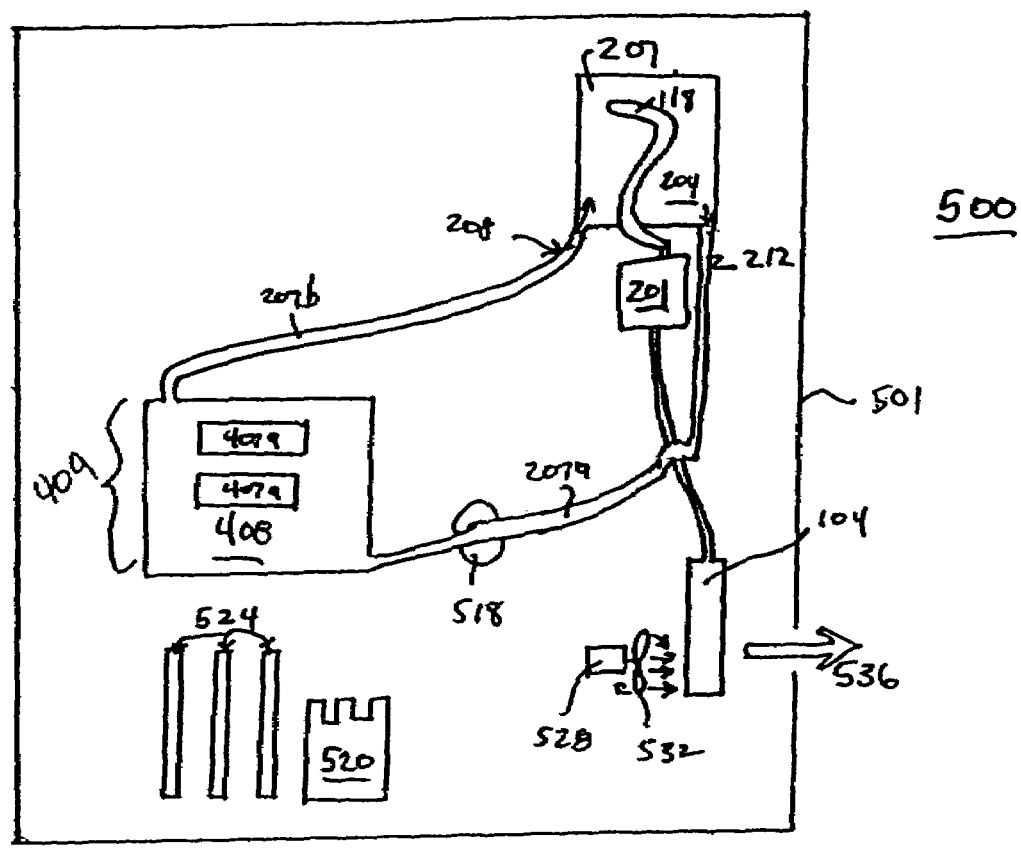
FIG. 5 depicts a schematic diagram of an embodiment of this invention having an absorptive cooler within a shell, and an electronic device along with other components.

FIG. 5 is a schematic drawing of an embodiment of this invention 500 having an absorptive cooler therein. Evaporator 118 is depicted attached to the remainder of an absorptive cooler 201 shown connected to boiler 104. Evaporator 118 is within reservoir 204 containing heat exchange fluid 207. Tube 212 carries cooled heat exchange fluid 207a to electronic device 408 containing electronic components 407a by pump 518. Heat produced by component 408 warms heat exchange fluid 207b, which is then passed back via tube 208 to reservoir 204 to be cooled. Shell 501 contains within it, heat-producing elements 520, 524 and 404. Heat from elements 520, 404 and 524 warms air 536 within shell 501. Motor 528 and fan 532 pulls warm air 536 past boiler 104 and outside shell 501 to provide heat to power the absorptive cooler.

In several embodiments, elements to be cooled can be thermally isolated from other elements in an electronic device. For example, to selectively cool a CPU, the CPU can be mounted on a cooling platform and have a housing placed over the CPU, leaving a space between the CPU and the cover of the housing, thereby providing a cooling vessel. Heat exchange fluid can be pumped into the vessel and can make direct contact with the CPU. By providing direct contact between a heat exchange liquid and the CPU, the amount of heat transferred from the CPU can increase compared to CPUs in a gas, such as in air, nitrogen or other gases used to conventionally cool electronic devices. Such direct liquid cooling can also decreased the likelihood of a CPU producing a "hot spot", which can degrade performance and decrease CPU life.

In other embodiments, heat-producing elements can be thermally isolated from other portions of the electrical device. In some of these embodiments, the heat produced by such elements (e.g., transformers and/or motors) can be transferred to a boiler to drive the absorptive cooler.

In still further embodiments, thermoelectric devices can be used. In such devices, including a Peltier device, one side of the thermoelectric device becomes cool or cold, while the other becomes heated. In such embodiments, the hot side of a thermoelectric device can be placed near a boiler of an absorptive cooler, and the otherwise wasted heat can be used to drive the cooling process.

In other embodiments, it may be desirable to provide additional types of cooling, such as compression refrigerators and the like.

Figure 6:
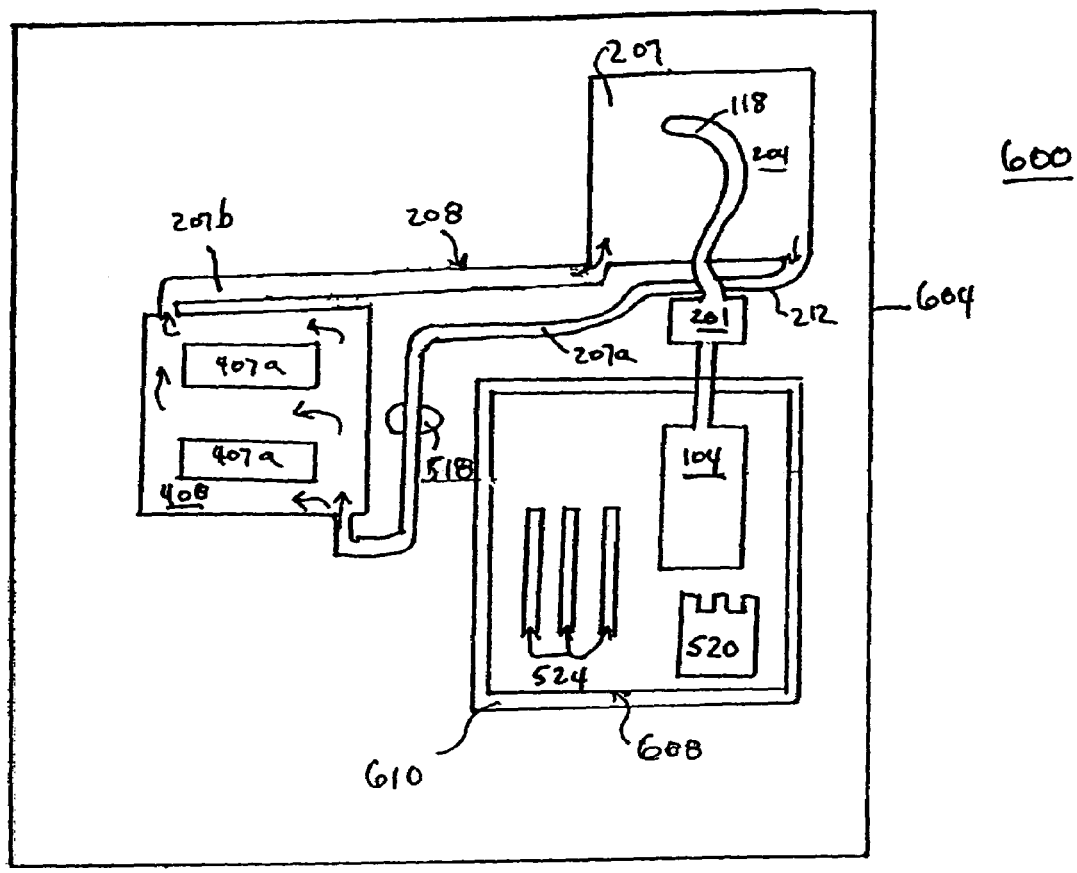
FIG. 6 depicts a schematic diagram of an alternative embodiment of this invention having a absorptive cooler within an electronic device and wherein heat generating components are in a cowling near a boiler of the absorptive cooler.

FIG. 6 depicts a schematic diagram of an alternative embodiment 600 of this invention, having shell 604 housing components of a system. Heat sources 520 and 524 and boiler 104 are housed within cowling 608. Most of the heat produced by sources 520 and 524 heat boiler 104, which is shown attached to the remainder of cooler 201 and evaporator 118 as in previous figures. As in FIG. 5, evaporator 118 is within a reservoir 204 containing heat exchange fluid 207, which circulates via pump 518 and tube 212 to electrical component 404. Cool heat exchange fluid 207a cools electrical component 408 containing devices 407a, thereby warming heat exchange fluid 207b, which is then carried back to compartment housing evaporator 118 via tube 208. Heat sources 520 and/or 524 may be transformers, circuit boards or other components that produce significant amounts of heat. Cowling 608 localizes heat produced by sources 520 and 524 to provide heat to boiler 104 and to avoid heating up other components in shell 604. If desired, insulation layer 610 can be added to improve efficiency of heat retention within cowling 608.

Figure 7:
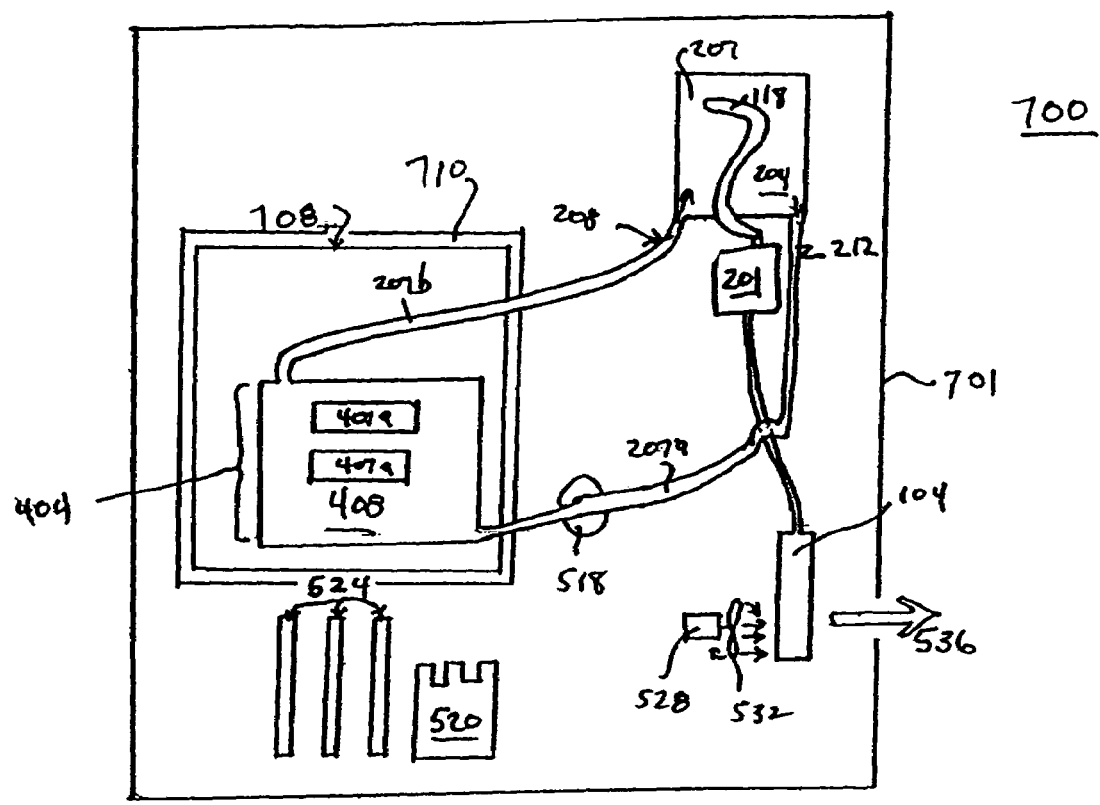
FIG. 7 depicts a schematic diagram of another embodiment of this invention having a absorptive cooler and an electrical component to be cooled housed within a cowling within the electronic device.

FIG. 7 depicts a schematic diagram of another embodiment 700 of this invention. As in FIG. 5, heating elements 520 and 524 produce heat within shell 701. Motor 728 and fan 732 pull heated air 536 from within shell 701 past boiler 104, and then to outside shell 701, thereby powering absorptive cooler 201 with evaporator 118 within reservoir 204 containing heat exchange fluid 207. Heat exchange fluid 207 is pumped by pump 518 through tube 212 to electrical component 408 containing devices 407a. Cool heat exchange fluid 207a enters cowling 708 which houses electrical component 408 and cools component 408 and device 407a. Warm heat exchange fluid 207b exits cowling 708 and is returned via tube 208 to compartment housing evaporator 118 of absorptive cooling apparatus. If desired, insulating layer 710 can be applied to cowling 708, thereby keeping heat produced by elements 520 and 524 from electronic component 404.

Figure 8A:
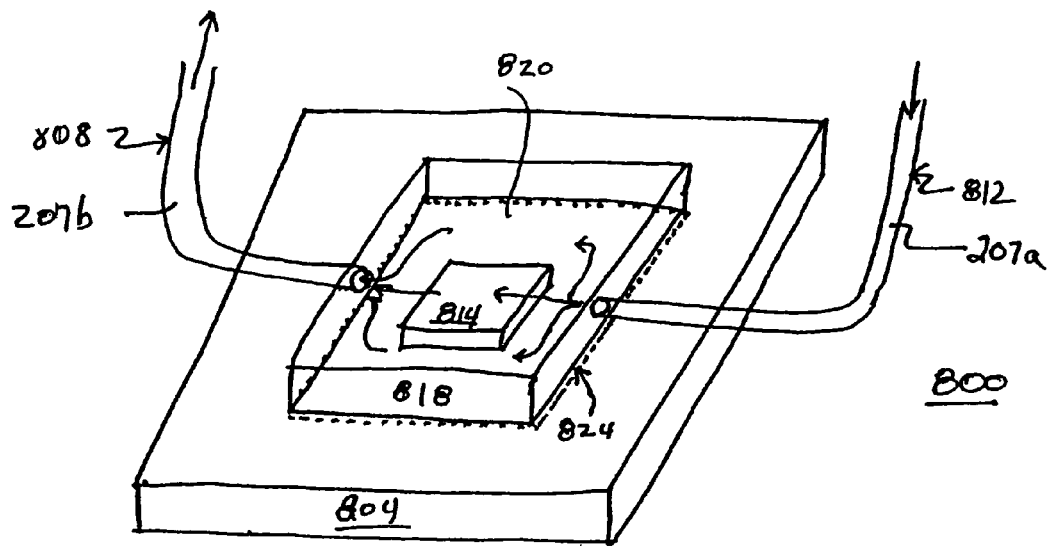
FIG. 8*a* depicts a perspective view of a portion of an embodiment of this invention having a cooling vessel with a CPU therein exposed to a heat exchange liquid.
Figure 8B:
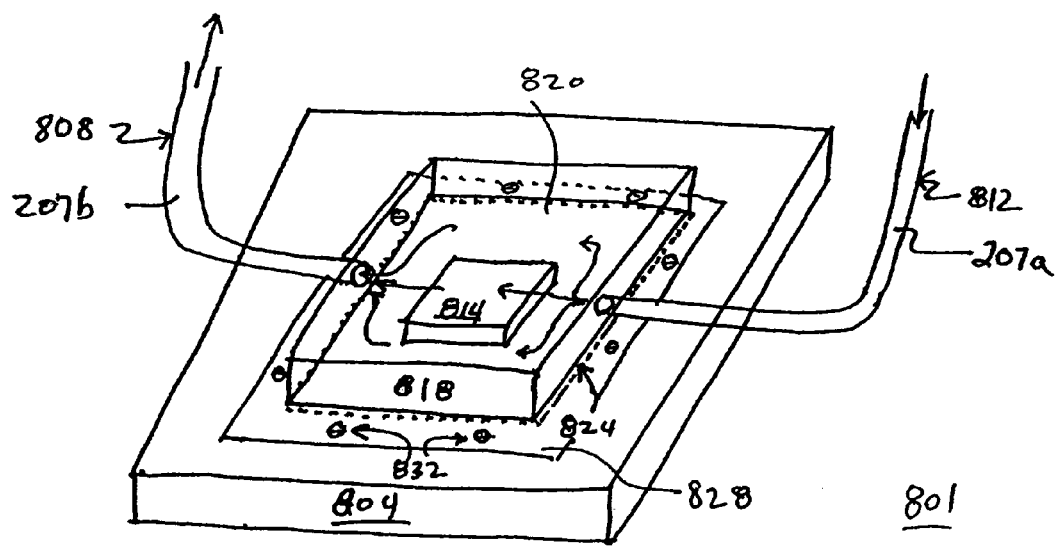
FIG. 8*b* depicts a perspective view of a portion of an embodiment of this invention as in FIG. 8*a* with a removable cover for the cooling vessel to permit replacement of the CPU.

FIGS. 8a and 8b depict schematic drawings of embodiments of this invention. FIG. 8a depicts an embodiment 800 having a base 804 upon which device 814 is placed, thereby defining a space 820. Housing 818 is attached to base 804 as shown by the dashed line 824. Tube 812 carries cooled heat exchange fluid 207a into space 820, which is circulated (arrows) through space 820 by a pump (not shown). Heat produced by device 814 is transferred to heat exchange fluid 207a to produce warmed heat exchange fluid 207b, which is then carried by tube 808 back to the absorptive cooler (not shown).

FIG. 8b depicts an embodiment 801 similar to that shown above in FIG. 8a having flange 828 having fasteners 832 holding housing 818 to base 804, thereby permitting periodic removal of housing 808 to permit servicing or replacement of device 814.

It can be appreciated that in embodiments in which a heat exchange fluid comes into contact with a heat producing electrical element, such as 814 of FIG. 8a or 8b, that the device should be manufactured using materials and methods that protect it from possible damage caused by the heat exchange fluid. It can also be appreciated that the seal between housing 818 and base elements 804 of FIGS. 8a and 8b should be sufficiently secure to prevent leakage of a heat exchange fluid from the housing.

Figure 9:
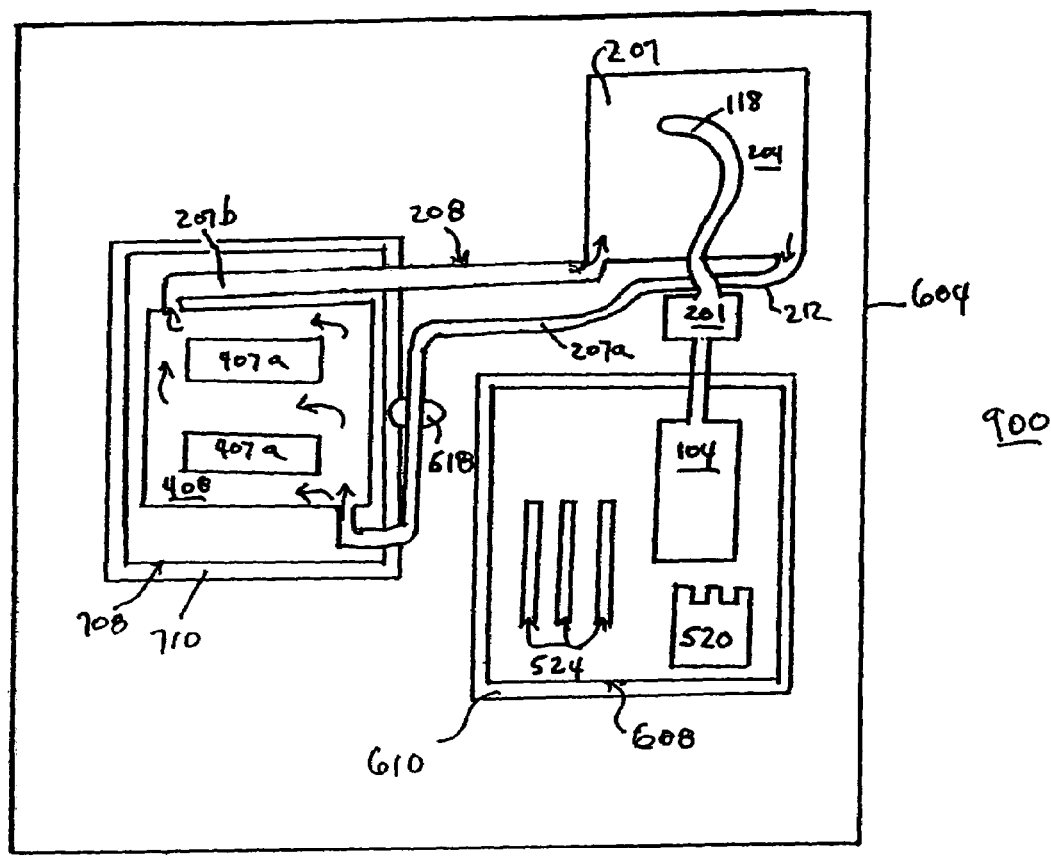
FIG. 9 depicts an alternative embodiment of this invention, similar to the embodiment depicted in FIG. 6 and having a cowling around active electronic components.

FIG. 9 depicts an alternative embodiment of this invention 900 similar to that depicted in FIG. 6 and having cowling 708 around electrical component 408. If desired, optional insulating layer 710 can be applied to cowling 708 to provide thermal isolation of electrical component 408 from the remainder of the device in housing 604. Embodiments such as 900 have an advantage in the heat producing elements can be individually thermally isolated, thereby providing efficient boiling in boiler 104, and efficient cooling of heat producing electronic device 408 and other elements needing cooling.

Figure 10:
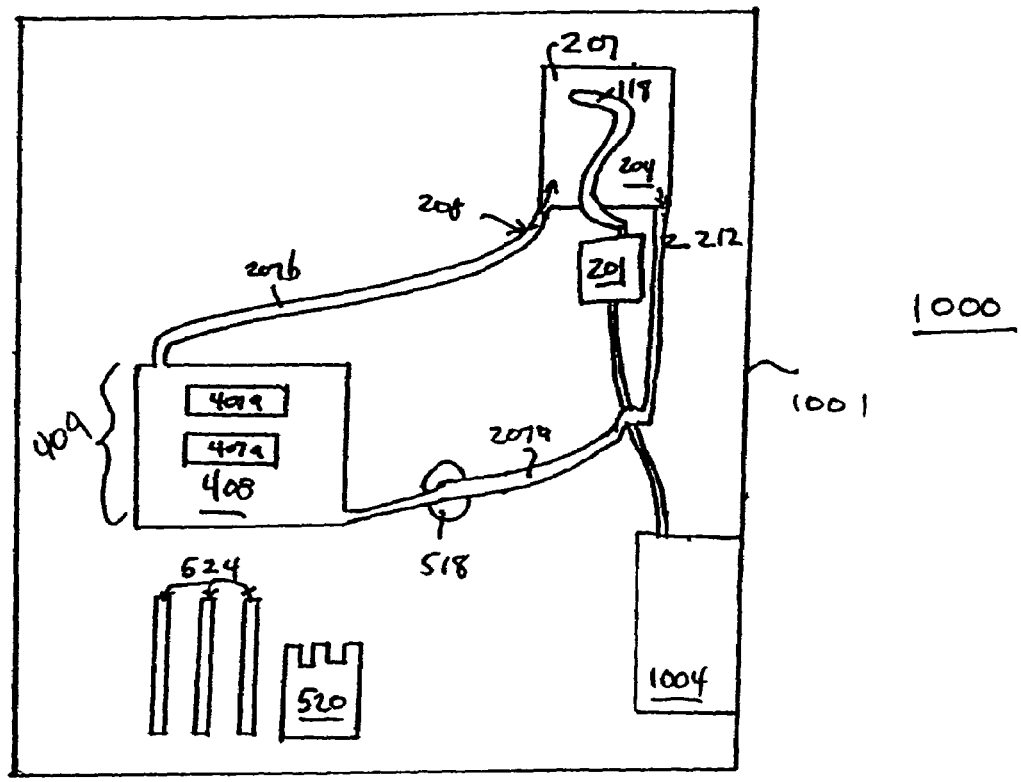
FIG. 10 depicts an alternative embodiment of this invention, similar to that shown in FIG. 5, with a condenser being part of the shell of the device.

FIG. 10 depicts an alternative embodiment of this invention 1000 similar to that depicted in FIG. 5 and having boiler 1004 as part of housing 1001. Other numbered elements shown are identical to corresponding elements in FIG. 5.

Figure 11:
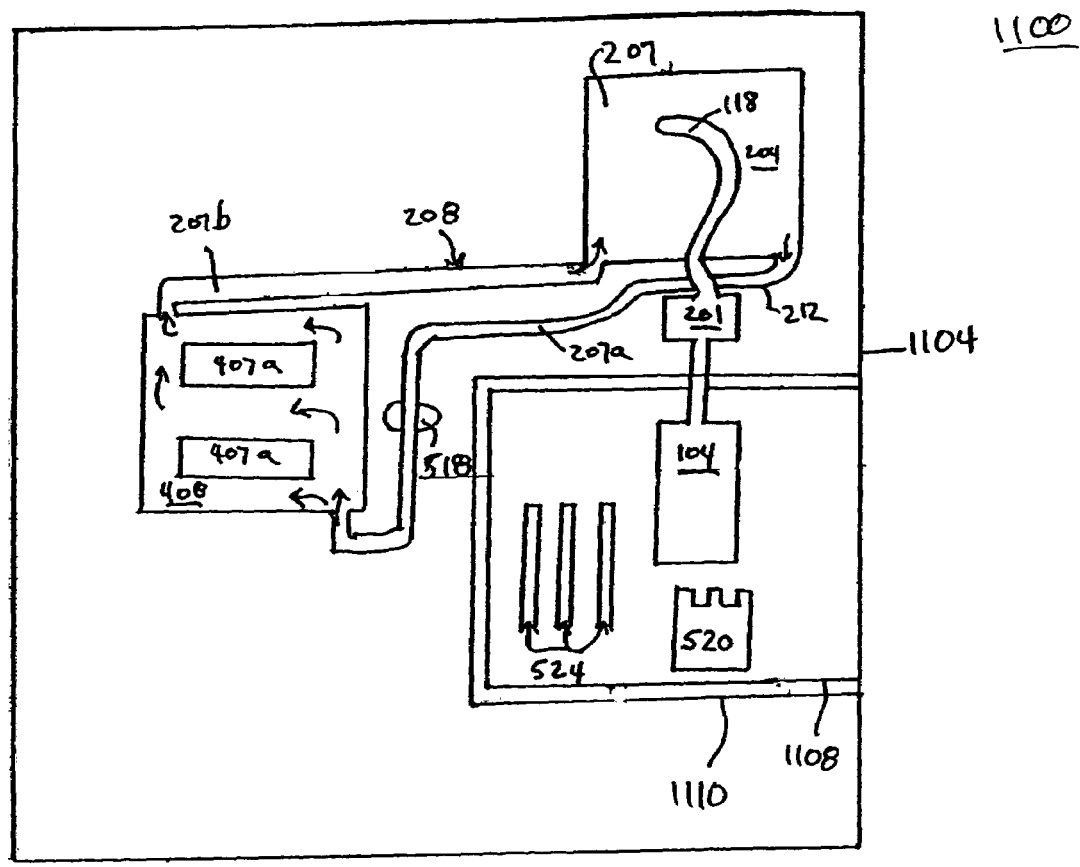
FIG. 11 depicts an alternative embodiment of this invention, similar to that shown in FIG. 6, with heat-generating structures enclosed in a compartment having the shell of the device as a wall of the enclosure.

FIG. 11 depicts an alternative embodiment of this invention 1100 similar to that depicted in FIG. 6 but wherein cowling wall 1108 and insulating layer 1110 are attached to shell (or housing) 1104, thereby providing means for heat produced within the cowling to escape to the outside of the device. Other numbered elements shown are identical to corresponding elements in FIG. 6.

Figure 12:
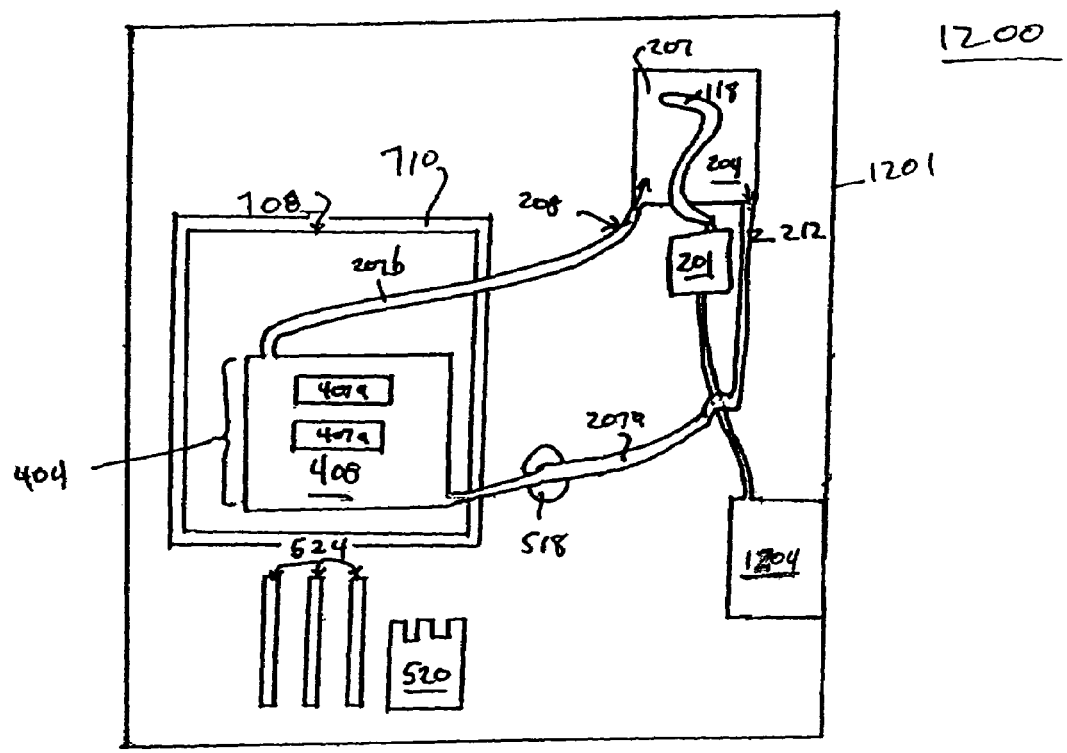
FIG. 12 depicts an alternative embodiment of this invention, similar to that shown in FIG. 7, with a condenser being part of the shell of the device.

FIG. 12 depicts an alternative embodiment of this invention 1200 similar to that depicted in FIG. 7, wherein boiler 1204 is in direct contact with housing (or shell) 1201, thereby permitting heat from the condenser 1204 to escape from the device. Other numbered elements shown are identical to corresponding elements in FIG. 7.

Figure 13:
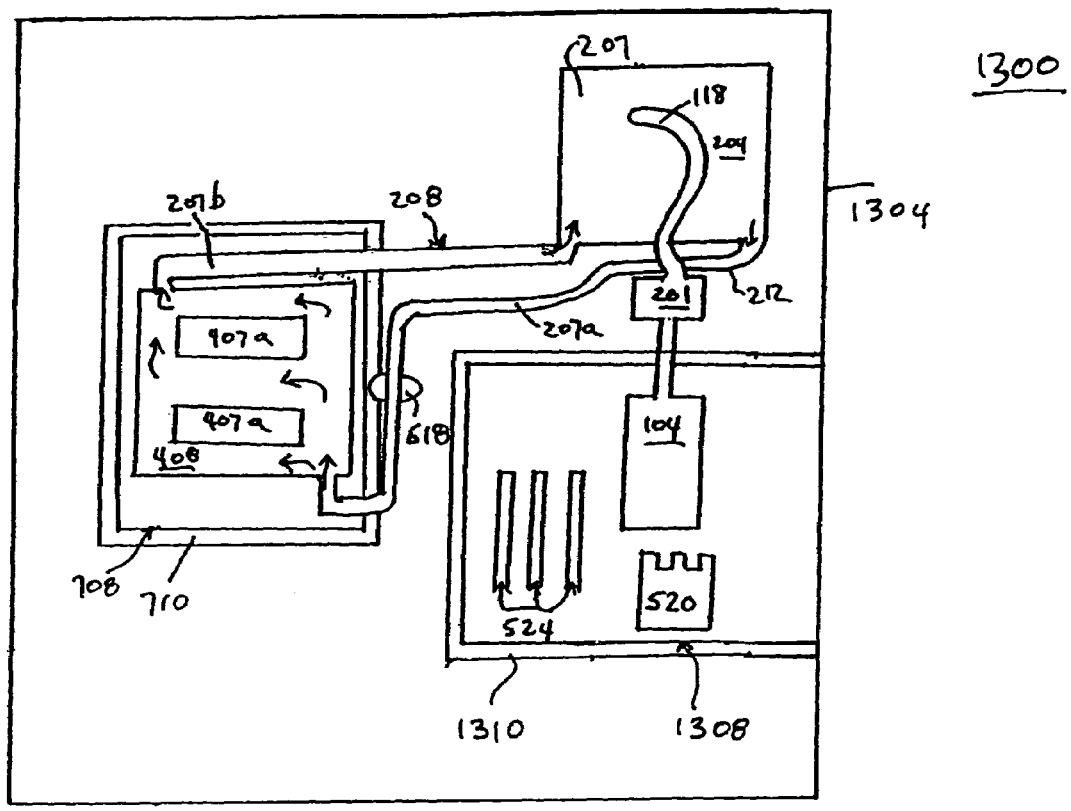
FIG. 13 depicts an alternative embodiment of this invention, similar to that shown in FIG. 9, with heat-generating structures enclosed in a compartment having the shell of the device as a wall of the enclosure.

FIG. 13 depicts an alternative embodiment of this invention 1300 similar to that shown in FIG. 9, but wherein cowling wall 1308 and insulation 1310 are in direct contact with housing or shell 1304, thereby permitting heat produced within the cowling to escape to the outside of the device. Other numbered elements shown are identical to corresponding elements in FIG. 9.

Any convenient heat exchange fluid may be used, so long as it is relatively inert with respect to the elements with which it makes contact. Additionally, the heat exchange fluid should have sufficiently low dielectric constant so as not to disrupt electronic functions of the electronic device (814 of FIGS. 8*a* and 8*b*). In some cases, water can be desirably used, having a high heat carrying capacity. In alternative embodiments, aqueous solutions having other fluids (e.g., polyethylene glycols, alcohols and the like), or freons, oils and the like may be used.

This invention is described with respect to specific embodiments thereof. It can be appreciated that numerous other configurations of an adsorptive cooler and electronic components can be produced.

I claim:

1. An electronic device, comprising a shell, said shell containing:
   an absorptive cooler having a boiler, a heat exchange fluid and an evaporator,
   a heat-producing component; and
   an active electronic component;
   said boiler in thermal contact with said heat-producing component, wherein said heat-producing component and said boiler are housed within a cowling, wherein said boiler is adapted to receive heat produced by one or both of said active electronic component and said heat-producing component, and said evaporator in thermal contact with said active electronic component, wherein cooling at evaporator results in cooling of said active electronic component via said heat exchange fluid.

2. The device of claim 1, wherein said cowling has an insulating layer thereon.

3. The device of claim 1, wherein said active electronic component is within a housing;
   said housing adapted to permit circulation of said heat exchange fluid therethrough;
   said heat exchange fluid in contact with said active electronic component permitting heat to flow from said active electronic component into said heat exchange fluid.

4. The device of claim 3, wherein said active electronic component and said boiler are within a cowling.

5. The device of claim 1, wherein said boiler is in contact with said shell.

6. A method for cooling an electronic component, comprising:
   providing a shell having therein:
      an active electronic component in need of cooling in a cowling to insulate said component from heat produced by other components;
      a heat source;
      an absorptive cooler having a boiler, a heat exchange fluid and an evaporator; and permitting heat produced by one or both of said heat source and said active electronic component to warm said boiler.

7. The method of claim 6, further comprising the step of placing said active electronic component in a cowling to insulate said component from heat produced by said heat source.

8. The method of claim 6, further comprising the step of placing said heat source and said boiler in a cowling to increase heat transfer from said heat source to said boiler.

9. The method of claim 8, further comprising the step of placing said active electronic component in a cowling to insulate said component from heat produced by said heat source.

\* \* \* \* \*